(12) United States Patent
Toujo (10) Patent No.: US 11,699,544 B2
(45) Date of Patent: Jul. 11, 2023

(54) COIL COMPONENT AND FILTER CIRCUIT INCLUDING SAME

(71) Applicant: Murata Manufacturing Co., Ltd., Nagaokakyo (JP)

(72) Inventor: Atsushi Toujo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 360 days.

(21) Appl. No.: 16/874,752

(22) Filed: May 15, 2020

(65) Prior Publication Data
US 2020/0279684 A1    Sep. 3, 2020

Related U.S. Application Data

(63) Continuation of application No. PCT/JP2018/037200, filed on Oct. 4, 2018.

(30) Foreign Application Priority Data

Mar. 27, 2018    (JP) .................. 2018-059405

(51) Int. Cl.
  *H01F 17/00*    (2006.01)
  *H01F 27/28*    (2006.01)

(52) U.S. Cl.
  CPC ......... *H01F 17/0013* (2013.01); *H01F 17/00* (2013.01); *H01F 27/2866* (2013.01); *H01F 2017/0026* (2013.01)

(58) Field of Classification Search
  CPC ...... H01F 17/00; H01F 27/28; H01F 17/0013; H01F 2017/0026; H01F 27/2866; H03H 7/09; H03H 9/54; H03H 9/02; H03H 7/01; H03H 7/0115; H03H 7/1766; H03H 2001/0085

USPC .................................................. 361/117–119
See application file for complete search history.

(56) References Cited

U.S. PATENT DOCUMENTS

| | | | | |
|---|---|---|---|---|
| 4,904,967 A | * | 2/1990 | Morii | H03H 1/0007 361/321.1 |
| 5,602,517 A | | 2/1997 | Kaneko et al. | |
| 6,476,689 B1 | * | 11/2002 | Uchida | H03H 7/0115 333/185 |
| 2007/0025043 A1 | * | 2/2007 | Terada | H01G 4/30 361/118 |
| 2016/0182001 A1 | * | 6/2016 | Zeng | H03H 1/0007 336/105 |
| 2016/0307702 A1 | | 10/2016 | Tanaka et al. | |

(Continued)

FOREIGN PATENT DOCUMENTS

| | | |
|---|---|---|
| JP | 08-46471 A | 2/1996 |
| JP | 10-13180 A | 1/1998 |
| JP | 10-215134 A | 8/1998 |

(Continued)

OTHER PUBLICATIONS

Official Communication issued in International Patent Application No. PCT/JP2018/037200, dated Nov. 13, 2018.

*Primary Examiner* — Danny Nguyen
(74) *Attorney, Agent, or Firm* — Keating & Bennett, LLP (57) ABSTRACT

A coil component includes a first coil and a second coil that magnetically couples with the coil and causes a negative inductance to be generated. The coil component further includes an electrode that is provided at a position adjacent to or in the vicinity of a port of each of the first and second coils.

18 Claims, 8 Drawing Sheets

(56) References Cited

U.S. PATENT DOCUMENTS

2018/0040427 A1* 2/2018 Toujo ................ H03H 7/09

FOREIGN PATENT DOCUMENTS

| JP | 2001-160728 A | 6/2001 |
| JP | 2016-201517 A | 12/2016 |

* cited by examiner

COIL COMPONENT AND FILTER CIRCUIT INCLUDING SAME

CROSS REFERENCE TO RELATED APPLICATIONS

This application claims the benefit of priority to Japanese Patent Application No. 2018-059405 filed on Mar. 27, 2018 and is a Continuation Application of PCT Application No. PCT/JP2018/037200 filed on Oct. 4, 2018. The entire contents of each application are hereby incorporated herein by reference.

BACKGROUND OF THE INVENTION

1. Field of the Invention

The present invention relates to a coil component and a filter circuit including the coil component.

2. Description of the Related Art

Filter circuits are often used to reduce noise in electronic devices. For example, such a filter circuit may include an electromagnetic interference (EMI) removal filter and the filter circuit allows a necessary component of a current flowing along a conductor to pass therethrough and removes an unwanted component from the current. A capacitor, which is a capacitance element, may be used in the circuit configuration of such a filter circuit. It is known that the noise suppressing effect of a filter circuit that uses a capacitor is degraded by the equivalent series inductance (ESL), which is a parasitic inductance, of the capacitor.

A technique for canceling out the equivalent series inductance of the capacitor is known which consists of widening the frequency band where the attenuation effect of the filter circuit occurs by using a negative inductance generated by two magnetically coupled coils (for example, refer to Japanese Unexamined Patent Application Publication No. 2001-160728).

However, there is a problem in that although the equivalent series inductance of the capacitor can be canceled out by the negative inductance generated by the two magnetically coupled coils, widening the frequency band where the attenuation effect of the filter circuit occurs is restricted by stray capacitances generated by the two magnetically coupled coils. Specifically, with generation of a stray capacitance of 1 pF, a noise signal of 1 GHz or higher passes through the filter circuit via the stray capacitance with a loss of several dB, and the attenuation effect of the filter circuit is substantially limited to frequencies lower than the MHz band.

SUMMARY OF THE INVENTION

Preferred embodiments of the present invention provide coil components that are each able to reduce a frequency band of a noise signal that passes through a plurality of magnetically coupled coils, and filter circuits that each include a coil component.

A coil component according to a preferred embodiment of the present invention includes a plurality of coils magnetically couple with each other. The coil component includes a first coil, a second coil that magnetically couples with the first coil and causes a negative inductance to be generated, and an electrode that is provided at a position adjacent to or in a vicinity of a portion of the first coil and a portion of the second coil and is grounded.

A filter circuit according to a preferred embodiment of the present invention includes a coil component and a capacitor according to a preferred embodiment of the present invention including one end that is connected to the first coil and the second coil.

According to preferred embodiments of the present invention, the grounded electrode is provided at a position adjacent to or in the vicinity of a portion of the first coil and a portion of the second coil, and as a result, a noise signal in a frequency band that would pass through the coil component via stray capacitances of the coils is able to be made to flow toward the electrode and the frequency band of a noise signal that passes through the coil component is able to be reduced. In addition, in the filter circuits each including such a coil component, a noise signal of a frequency band that would pass through the coil component via the stray capacitances of the coils is able to be made to flow toward the electrode, and therefore, the frequency band where the attenuation effect of the filter circuit occurs is able to be widened.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, coil components and filter circuits each including a coil component according to preferred embodiments of the present invention will be described with reference to the drawings.

Preferred Embodiment 1

Figure 1A:
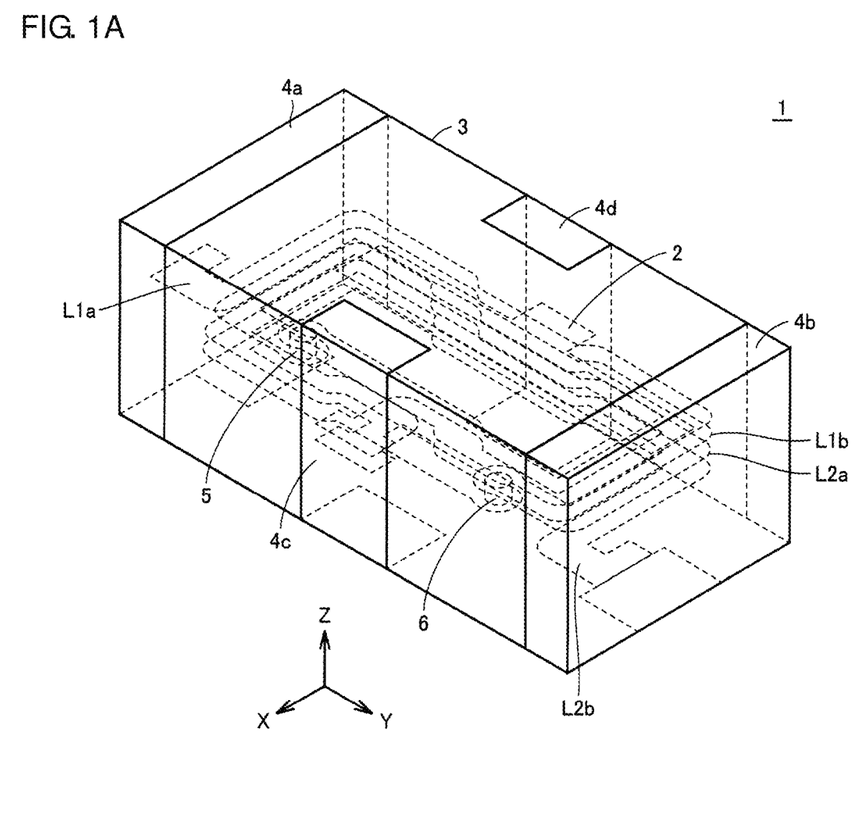
FIGS. 1A and 1B are a perspective view and a side view of a coil component according to a preferred embodiment 1 of the present invention.
Figure 1B:
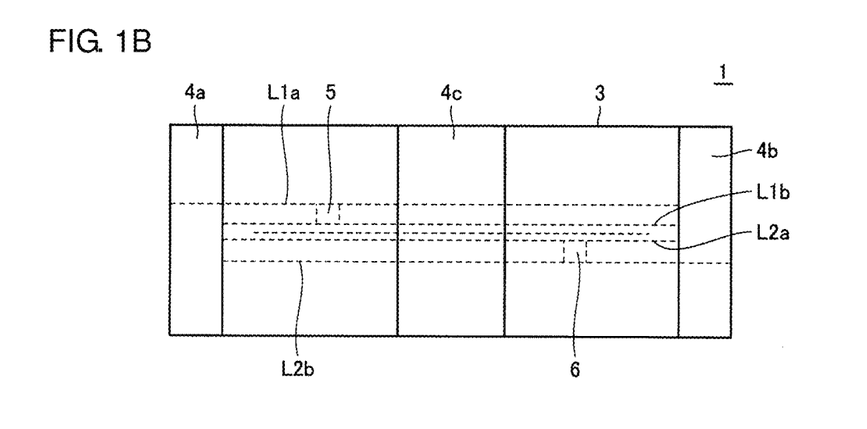

First, a coil component according to a preferred embodiment 1 of the present invention and a filter circuit including the coil component will be described. FIGS. 1A and 1B are a perspective view and a side view of a coil component according to preferred embodiment 1 of the present invention. FIGS. 2A to 2E are exploded plan views illustrating the configuration of the coil component according to preferred embodiment 1 of the present invention. FIG. 3 is a circuit diagram of a filter circuit that includes the coil component according to preferred embodiment 1 of present invention.

A filter circuit 10 is preferably, for example, an EMI removal filter and is a third order T-type LC filter circuit. A coil component 1 is used in the filter circuit 10. In preferred embodiment 1, it is described that, for example, a third-order T-type LC filter circuit is used as the configuration of the filter circuit 10, but the present invention can be similarly applied to a fifth-order T-type LC circuit or an even higher order T-type LC circuit, for example. First, as illustrated in FIG. 3, the filter circuit 10 includes a capacitor C1, electrodes 4a to 4d, a coil L1 (first coil), and a coil L2 (second coil).

As illustrated in FIG. 3, one terminal of the capacitor C1 is connected to the electrode 4c and the other terminal of the capacitor C1 is connected to a GND wiring line. The capacitor C1 is not limited to being a multilayer ceramic capacitor including $BaTiO_3$ (barium titanate) as a main component and may instead be a multilayer ceramic capacitor including another material as a main component or may be another type of capacitor, such as, for example, an aluminum electrolytic capacitor rather than a multilayer ceramic capacitor. Although not illustrated, the capacitor C1 has a parasitic inductance (equivalent series inductance (ESL)).

In addition to the capacitor C1, the coil L1 and the coil L2 are also connected to the electrode 4c. The coil L1 and the coil L2 are magnetically coupled with each other and generate a negative inductance component. The parasitic inductance of the capacitor C1 can be canceled out by using this negative inductance component and the inductance component of the capacitor C1 can be effectively reduced. The filter circuit 10, which includes the capacitor C1, the coil L1, and the coil L2, is able to improve a high-frequency-band noise suppression effect by canceling out the parasitic inductance of the capacitor C1 by using the negative inductance component generated by the mutual inductance between the coil L1 and the coil L2.

However, widening of the frequency band where the attenuation effect of the filter circuit 10 occurs is restricted by stray capacitances C2 and C3 generated by the magnetically coupled coil L1 and coil L2. In other words, since the impedance of a capacitor decreases as the frequency of a signal increases, a high-frequency noise signal may pass through the filter circuit 10 via the stray capacitances C2 and C3 and this will restrict the attenuation effect of the filter circuit 10. For example, in the case where the capacitance of the stray capacitances C2 and C3 is about 1 pF, a noise signal of about 1 GHz or higher passes through the filter circuit 10 via the stray capacitances C2 and C3 with a loss of several dB and the attenuation effect of the filter circuit 10 is substantially limited to frequencies less than the MHz band.

Although it is conceivable to increase the distance between the coil L1 and the coil L2 in order reduce the capacitances of the stray capacitances C2 and C3 so that the attenuation effect of the filter circuit 10 is not limited, the magnetic coupling would be weakened and the required negative inductance would not be obtained when the distance between the coil L1 and the coil L2 is large. In order to obtain the required negative inductance while increasing the distance between the coil L1 and the coil L2, it would be necessary to increase the size of the coils L1 and L2 and the filter circuit 10 would be undesirably increased in size.

Accordingly, in the coil component 1 according to preferred embodiment 1, an electrode 2 is provided at a position that is adjacent to or in the vicinity of a portion of the coil L1 and a portion of the coil L2. As is clear from FIGS. 1A and 1B, the electrode 2 is electrically connected to the electrode 4d that is connected to GND, but is not electrically connected to the coil L1 and the coil L2. Therefore, the electrode 2 is equivalent to the circuit configuration illustrated in FIG. 3, which includes an inductor 2L as a parasitic inductance and a capacitor 2C as a parasitic capacitance. The inductor 2L and the capacitor 2C are connected in series with each other between the coil L1 and the coil L2 and the electrode 4d.

In the coil component 1, a high-frequency noise signal that has passed through the stray capacitances C2 and C3 can be made to flow to GND from the electrode 4d via the capacitor 2C by providing the electrode 2 at a position adjacent to or in the vicinity of the coil L1 and the coil L2. However, since the inductor 2L exists due to the electrode 2 being provided, the impedance with respect to GND cannot be reduced over a wide band. Basically, a noise signal in the vicinity of the resonant frequency of an series LC circuit including the inductor 2L, which is a parasitic inductance, and the capacitor 2C, which is a parasitic capacitance, generated due to the electrode 2 being provided can be made to flow to GND. Therefore, the frequency band where the attenuation effect of the filter circuit 10 that includes the coil component 1 occurs can be widened by making the resonant frequency of the series LC circuit generated due to the electrode 2 match the frequency at which attenuation cannot be obtained due to the stray capacitances C2 and C3 generated by the magnetically coupled coils L1 and L2.

As illustrated in FIGS. 1A and 1B, the coil component 1 is provided by stacking a plurality of substrates on which coil wiring lines are provided. One end of a wiring line L1a of the coil L1 stacked as an upper layer is electrically connected to the electrode 4a and the other end of the wiring line L1a is electrically connected to a wiring line Lib of the coil L1 in the layer below the upper layer through a via 5. One end of the wiring line Lib of the coil L1 is electrically connected to an electrode 4c and the other end of the wiring line Lib is electrically connected to the wiring line L1a of the coil L1 in the upper layer through the via 5. The coil L1 is defined by the wiring line L1a and the wiring line Lib. In the coil component 1 illustrated in of FIG. 1A, the short side direction is an X direction, the long side direction is a Y direction, and the height direction is a Z direction. In addition, the stacking direction of the substrates is a Z direction and the direction of the arrow indicates the direction of an upper layer.

Similarly, one end of a wiring line L2a of the coil L2 stacked below the coil L1 is electrically connected to the electrode 4c and the other end of the wiring line L2a is electrically connected to a wiring line L2b of the coil L2 in the layer therebelow through a via 6. One end of the wiring line L2b of the coil L2 is electrically connected to the electrode 4b and the other end of the wiring line L2b is electrically connected to the wiring line L2a of the coil L2 in the layer thereabove through the via 6. The coil L2 is defined by the wiring line L2a and the wiring line L2b.

In the coil component 1, furthermore, the electrode 2 is stacked between the wiring line Lib of the coil L1 and the wiring line L2a of the coil L2. One end of the electrode 2 is electrically connected to the electrode 4d and the electrode 2 is not electrically connected to the wiring line Lib and the wiring line L2a.

As illustrated in FIGS. 2A to 2E, wiring line patterns are provided on ceramic green sheets 3a to 3e by performing printing with a conductive paste (for example, Ni paste) using a screen printing method, for example. The wiring line L1a and additionally a wiring line pattern 40 that is connected to the electrode 4a and a wiring line pattern 5a that is connected to the via 5 are provided on the ceramic green sheet 3a illustrated in FIG. 2A.

Figure 2A:
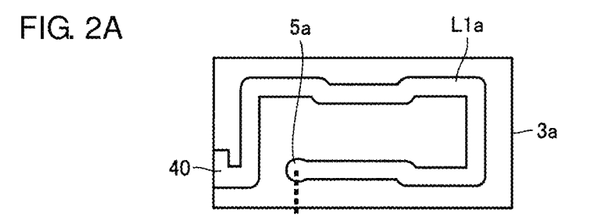
FIGS. 2A to 2E are exploded plan views illustrating the configuration of the coil component according to preferred embodiment 1 of the present invention.
Figure 2B:
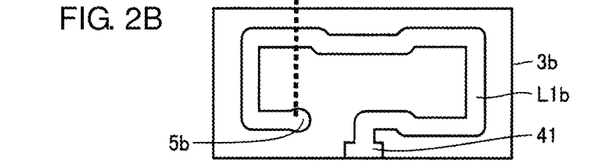
Figure 3:
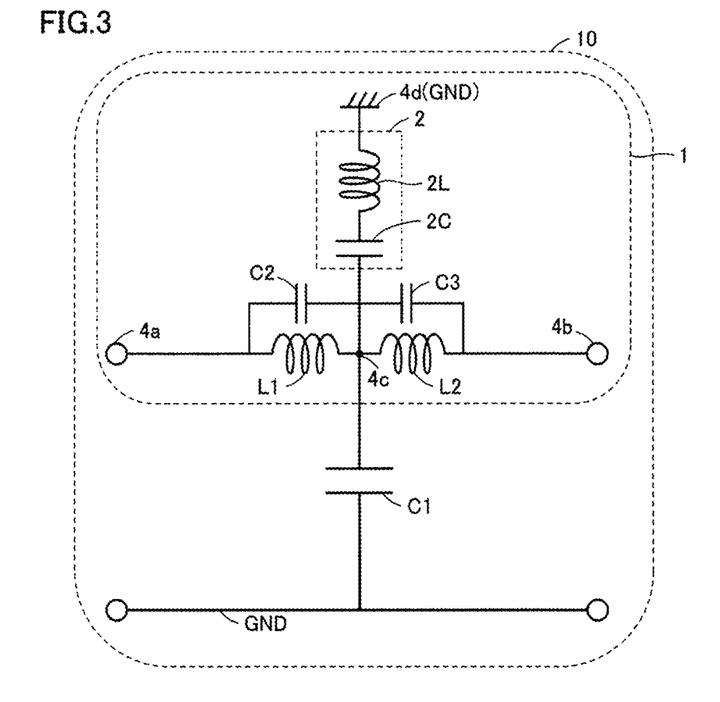
FIG. 3 is a circuit diagram of a filter circuit that includes the coil component according to preferred embodiment 1 of present invention.

The wiring line Lib and additionally a wiring line pattern 41 that is connected to the electrode 4c and a wiring line pattern 5b that is connected to the via 5 are provided on the ceramic green sheet 3b illustrated in FIG. 2B. The coil L1 is provided on the ceramic green sheets 3a and 3b.

Figure 2C:
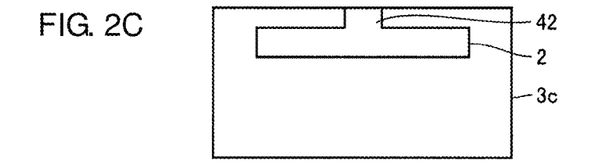

The electrode 2 and additionally a wiring line pattern 42 that is connected to the electrode 4d are provided on the ceramic green sheet 3c illustrated in FIG. 2C.

Figure 2D:
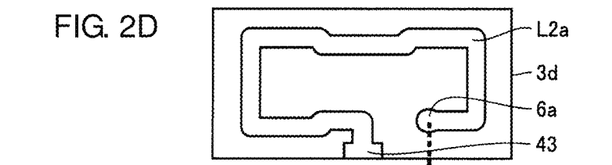
Figure 2E:
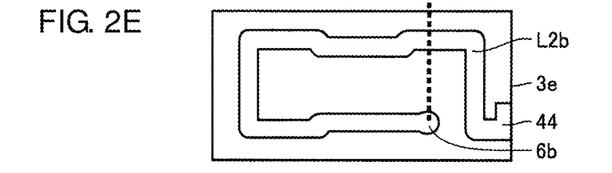

The wiring line L2a and additionally a wiring line pattern 43 that is connected to the electrode 4c and a wiring line pattern 6a that is connected to the via 6 are provided on the ceramic green sheet 3d illustrated in FIG. 2D. The wiring line L2b and additionally a wiring line pattern 44 that is connected to the electrode 4b and a wiring line pattern 6b that is connected to the via 6 are provided on the ceramic green sheet 3e illustrated in FIG. 2E. The coil L2 is provided on the ceramic green sheets 3d and 3e.

In the coil component 1, the plurality of ceramic green sheets 3a to 3e illustrated in FIGS. 2A to 2E are stacked on top of one another, and a plurality of ceramic green sheets on which wiring line patterns have not been provided by printing (dummy layers) are stacked above and below these stacked ceramic green sheets (refer to FIG. 1B). The plurality of ceramic green sheets 3 including the dummy layers are subjected to pressure bonding and an unfired multilayer body is formed. The multilayer body is fired and the electrodes 4a to 4d are formed by, for example, baking copper electrodes on the outside of the fired multilayer body so that the electrodes are electrically connected to the wiring line patterns 40 to 44.

Figure 4:
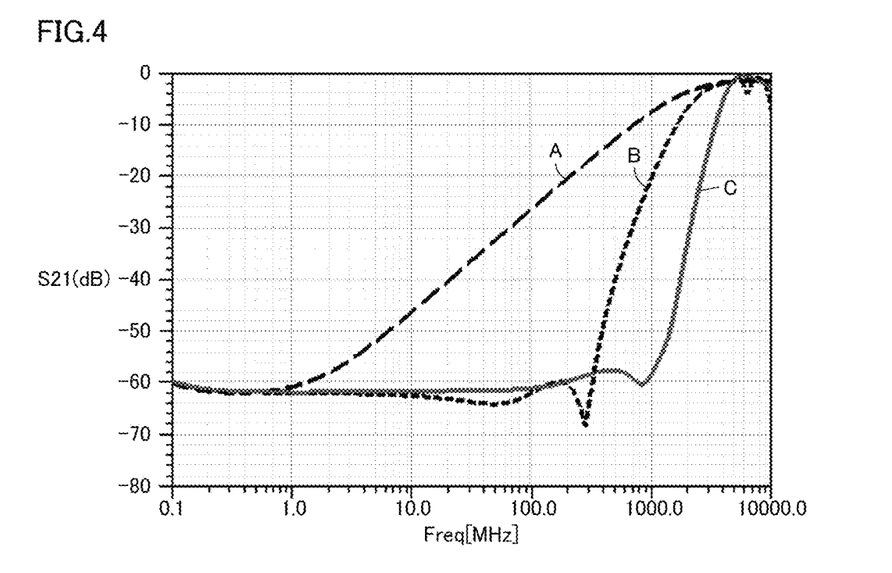
FIG. 4 is a graph illustrating a transmission characteristic with respect to frequency for a filter circuit including the coil component according to preferred embodiment 1 of the present invention.

FIG. 4 is a graph illustrating a transmission characteristic with respect to frequency for the filter circuit 10 including the coil component 1 according to preferred embodiment 1 of the present invention. A circuit simulation was performed for the filter circuit 10 illustrated in FIG. 3 and the results of the circuit simulation depicting a transmission characteristic with respect to frequency are illustrated as a graph in FIG. 4. In the graph illustrated in FIG. 4, the horizontal axis represents frequency Freq (MHz) and the vertical axis represents a transmission characteristic S21 (dB).

First, graph A in FIG. 4 is a graph illustrating the transmission characteristic of a filter circuit including only the capacitor C1. In the filter circuit including only the capacitor C1, the transmission characteristic S21 is high at frequencies greater than or equal to about 1.0 MHz and a noise signal in a high-frequency band cannot be reduced or prevented. Furthermore, graph B in FIG. 4 is a graph illustrating the transmission characteristic of a filter circuit including the capacitor C1 and the coils L1 and L2. In this filter circuit, the transmission characteristic S21 suddenly increases at frequencies greater than or equal to about 300.0 MHz and a noise signal in a 1 GHz high-frequency band cannot be reduced or prevented.

On the other hand, graph C in FIG. 4 is a graph illustrating the transmission characteristic of the filter circuit 10. In the filter circuit 10, the transmission characteristic S21 is sufficiently low at a frequency Freq of about 1 GHz and the effect of reducing or preventing noise in a high-frequency band can be improved.

Figure 5A:
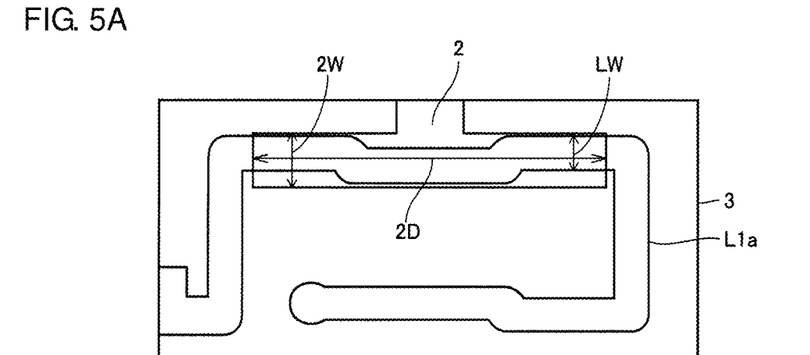
FIGS. 5A and 5B are diagrams for comparing sizes of an electrode and a coil wiring line of the coil component according to preferred embodiment 1 of the present invention.
Figure 5B:
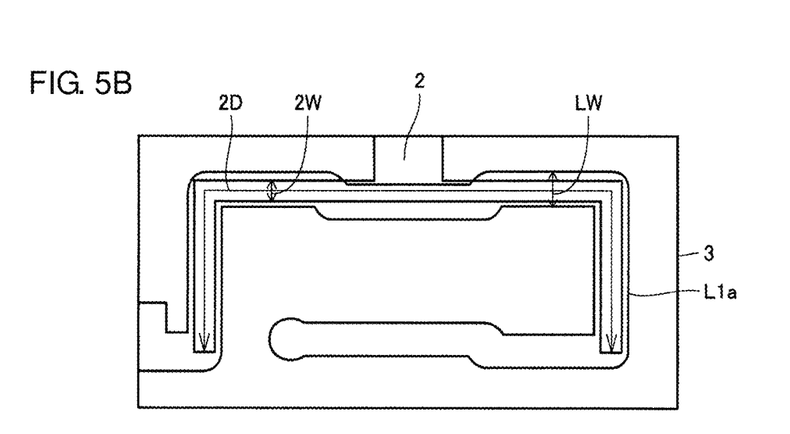

Next, changes that occur in the transmission characteristic S21 when the sizes the wiring lines of the coils L1 and L2 and the electrode 2 are varied will be described. FIGS. 5A and 5B are diagrams for comparing sizes of the electrode and coil wiring lines of the coil component according to preferred embodiment 1 of the present invention. The inductor 2L including the parasitic inductance and the capacitor 2C including the parasitic capacitance change depending on the overlapping state of the wiring lines of the coils L1 and L2 and the electrode 2, and therefore, the transmission characteristic S21 of the filter circuit 10 also changes.

In FIG. 5A, a width 2W of the electrode 2 is larger than a width LW of the wiring line L1a of the coil L1. In the following description, the widths of the wiring line Lib of the coil L1 and the wiring lines L2a and L2b of the coil L2 are preferably the same or substantially the same as the width LW of the wiring line Lia of the coil L1. However, the widths of the wiring line Lib of the coil L1 and the wiring line L2a and L2b of the coil L2 may instead be different from the width LW of the wiring line L1a of the coil L1.

The electrode 2 and the wiring line L1a of the coil L1 overlap each other. Therefore, it is preferable that a width difference arising from manufacturing variations be equivalent to the difference between the width 2W of the electrode 2 and the width LW of the wiring line L1a of the coil L1. For example, in order to reduce the effect of manufacturing variations, the width 2W of the electrode 2 is set to be larger than the width LW of the wiring line L1a of the coil L1 so that the area of the overlapping portion does not change even when the electrode 2 and the wiring line L1a of the coil L1 overlap but are shifted relative to each other. However, when the width 2W of the electrode 2 is larger than the width LW of the wiring line L1a of the coil L1, the transmission characteristic S21 of the filter circuit 10 in a high-frequency band deteriorates.

Figure 6:
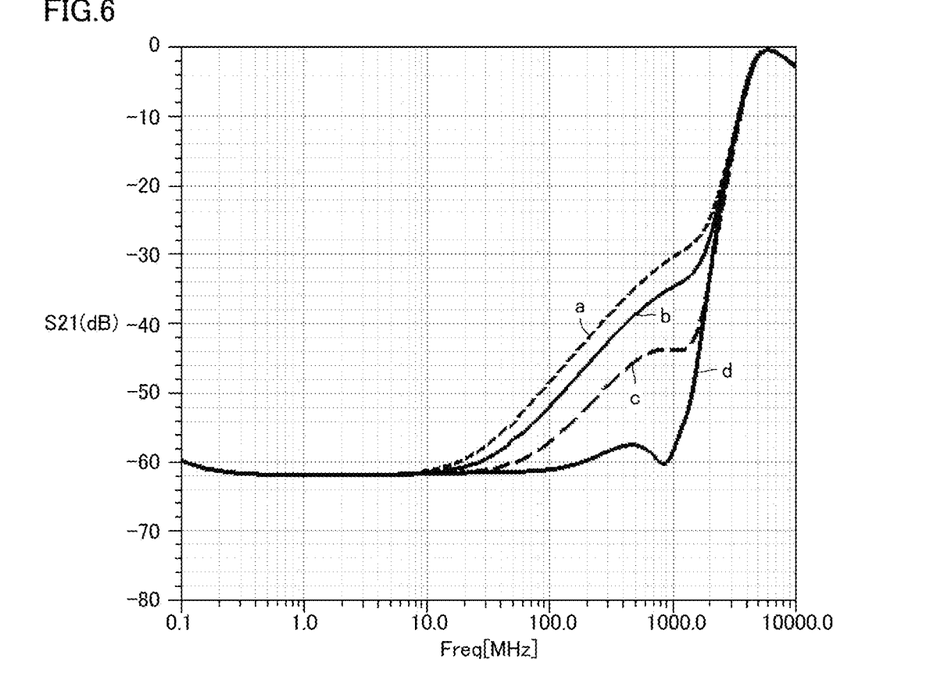
FIG. 6 is a graph illustrating a transmission characteristic with respect to frequency for the filter circuit when the width of the electrode of the coil component according to preferred embodiment 1 of the present invention is varied.

FIG. 6 is a graph illustrating a transmission characteristic with respect to frequency for the filter circuit when the width of the electrode of the coil component according to preferred embodiment 1 of the present invention is varied. A circuit simulation was performed for the filter circuit 10 illustrated in FIG. 3 by varying the width of the electrode 2 and the results of the circuit simulation showing the transmission characteristic S21 with respect to frequency are illustrated as a graph in FIG. 6. In the graph illustrated in FIG. 6, the horizontal axis represents frequency Freq (MHz) and the vertical axis represents the transmission characteristic S21 (dB).

Graph a in FIG. 6 is a graph illustrating the transmission characteristic S21 of the filter circuit 10 for a case where the width LW of the wiring line L1a of the coil L1 is about 100 µm and the width 2W of the electrode 2 is about 220 µm, for example. In the filter circuit 10 in which the width 2W is about 220 µm, the transmission characteristic S21 at a frequency Freq of about 1 GHz is high and a noise signal in a high-frequency band cannot be reduced or prevented. Graph b in FIG. 6 is a graph illustrating the transmission characteristic S21 of the filter circuit 10 for a case where the width LW of the wiring line L1a of the coil L1 is about 100 μm and the width 2W of the electrode 2 is about 200 μm, for example. In the filter circuit in which the width 2W is about 200 μm, the transmission characteristic S21 at a frequency Freq of about 1 GHz is high and a noise signal in a high-frequency band cannot be reduced or prevented.

Graph c in FIG. 6 is a graph illustrating the transmission characteristic S21 of the filter circuit 10 for a case where the width LW of the wiring line L1a of the coil L1 is about 100 μm and the width 2W of the electrode 2 is about 180 μm, for example. In the filter circuit 10 in which the width 2W is about 180 μm, the transmission characteristic S21 at a frequency Freq of about 1 GHz is slightly lower than when the width 2W is about 220 μm or about 200 μm and a noise signal in a high-frequency band can be slightly reduced or prevented. Graph d in FIG. 6 is a graph illustrating the transmission characteristic S21 of the filter circuit 10 for a case where the width LW of the wiring line L1a of the coil L1 is about 100 μm and the width 2W of the electrode 2 is about 160 μm, for example. In the filter circuit 10 in which the width 2W is about 160 μm, the transmission characteristic S21 at a frequency Freq of about 1 GHz is sufficiently low and a noise signal in a high-frequency band can be reduced or prevented.

As illustrated in FIG. 6, the transmission characteristic S21 of the filter circuit 10 rapidly deteriorates around the point where the width 2W of the electrode 2 exceeds about 180 μm. This is thought to be because the width 2W of the electrode 2 is larger than the width LW of the wiring line L1a of the coil L1 and, consequently, the magnetic fields of the coils L1 and L2 are obstructed and the inductance and magnetic coupling are caused to deteriorate. As a result, the transmission characteristic S21 of the filter circuit 10 is caused to rapidly deteriorate.

Accordingly, if a noise signal in a high-frequency band is to be more greatly reduced or prevented in the filter circuit 10, it is preferable for the width 2W of the electrode 2 to be less than or equal to about 1.8 times the width LW of the wiring line L1a of the coil L1 in the case where the width of the electrode 2 is larger than the width LW of the wiring line L1a of the coil L1.

On the other hand, in order to reduce the effect of manufacturing variations, in the case where the width 2W of the electrode 2 is smaller than the width LW of the wiring line L1a of the coil L1, it is necessary to increase a length 2D of the electrode 2 in accordance with the amount by which the width 2W of the electrode 2 has been reduced as illustrated in FIG. 5B because the value of the capacitor 2C generated by the electrode 2 is determined by the area of the electrode 2. In FIG. 5B, the relationship between the width 2W of the electrode 2 and the length 2D of the electrode 2 is illustrated. For example, when the width 2W of the electrode 2 is about 90 μm and the length 2D of the electrode 2 is about 1800 μm, the width 2W of the electrode 2 is about 1/20 the length 2D of the electrode 2. When the width 2W of the electrode 2 illustrated in FIG. 5A is about 160 μm and the length 2D of the electrode 2 is about 1120 μm, for example, the width 2W of the electrode 2 is about 1/7 the length 2D of the electrode 2. When the length 2D of the electrode 2 is increased, the length of the electrode 2 is increased along the wiring line L1a of the coil L1 as illustrated in FIG. 5B.

The resonant frequency of the series LC circuit including the inductor 2L, which is a parasitic inductance, and the capacitor 2C, which is a parasitic capacitance, generated due to the provision of the electrode 2 is determined by the sizes of the values of the inductor 2L and the capacitor 2C. As the capacitance of the capacitor 2C increases, the bandwidth of the resonant frequency of the series LC circuit becomes larger. Therefore, in order to increase the capacitance of the capacitor 2C, it is necessary to increase the width 2W of the electrode 2 or increase the length 2D by an amount corresponding to the reduction of the width 2W of the electrode 2. In the case where the width 2W of the electrode 2 is larger than the width LW of the wiring line L1a of the coil L1, the transmission characteristic S21 of the filter circuit 10 may rapidly deteriorate when the width 2W of the electrode 2 exceeds an upper limit as illustrated in FIG. 6.

Figure 7:
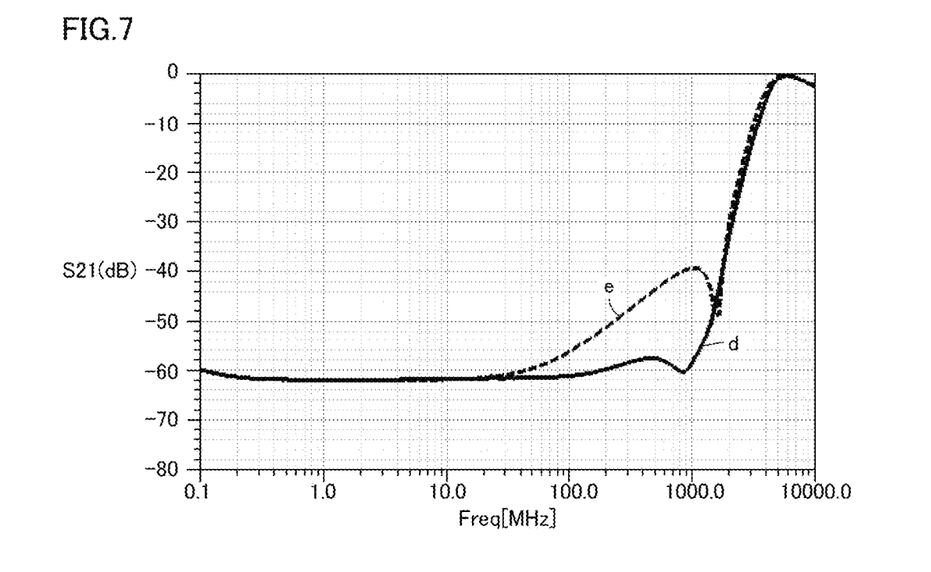
FIG. 7 is a graph illustrating a transmission characteristic with respect to frequency for the filter circuit when the size of the electrode of the coil component according to preferred embodiment 1 of the present invention is varied.

FIG. 7 is a graph illustrating the transmission characteristic with respect to frequency for the filter circuit when the size of the electrode of the coil component according to preferred embodiment 1 of the present invention is varied. A circuit simulation was performed for the filter circuit 10 illustrated in FIG. 3 by varying the size of the electrode 2 and the results of the circuit simulation showing the transmission characteristic with respect to frequency are illustrated as a graph in FIG. 7. In the graph illustrated in FIG. 7, the horizontal axis represents frequency Freq (MHz) and the vertical axis represents the transmission characteristic S21 (dB).

Graph d in FIG. 7 is a graph illustrating the transmission characteristic of the filter circuit 10 for a case where the width 2W of the electrode 2 is about 160 μm and the length 2D of the electrode 2 is about 1120 μm, for example. In this filter circuit, the transmission characteristic S21 at a frequency Freq of about 1 GHz is sufficiently low and a noise signal in a high-frequency band can be reduced or prevented. Graph e in FIG. 7 is a graph illustrating the transmission characteristic of the filter circuit 10 for a case where the width 2W of the electrode 2 is about 90 μm and the length 2D of the electrode 2 is about 1800 μm, for example. In this filter circuit, the transmission characteristic S21 at a frequency Freq of about 1 GHz is high and a noise signal in a high-frequency band cannot be reduced or prevented.

In other words, in the case where the width 2W of the electrode 2 is smaller than the width LW of the wiring line L1a of the coil L1, the transmission characteristic S21 of the filter circuit 10 at a frequency Freq of about 1 GHz is sufficiently low and a noise signal in a high-frequency band can be reduced or prevented to a greater extent if, for example, the width 2W of the electrode 2 lies in a range from about 1/7 to about 1/8 the length D of the electrode 2.

The relationship between the width LW of the wiring lines of the coils L1 and L2 and the width 2W of the electrode 2 in the coil component 1 has been described above, and next the spacing between the wiring lines of each of the coils L1 and L2 and the spacing between the electrode 2 and the wiring lines of the coils L1 and L2 will be described. As illustrated in FIG. 1B, the spacing between the electrode 2 and the wiring lines of the coils L1 and L2 is smaller than the spacing between the wiring lines of each of the coils L1 and L2. For example, the spacing between the wiring lines of each of the coils L1 and L2 is preferably about 50 μm, and the spacing between the electrode 2 and the wiring lines of the coils L1 and L2 is preferably smaller than about 20 μm. In other words, in order to secure a sufficient parasitic capacitance capacitor 2C to obtain the resonant frequency required for the LC series circuit, the spacing between the electrode 2 and the wiring lines of the coils L1 and L2 is set to be smaller than the spacing between the wiring lines of each of the coils L1 and L2.

As described above, the coil component 1 according to preferred embodiment 1 of the present invention includes a plurality of coils magnetically couple with each other, and includes the coil L1, the coil L2 that magnetically couples with the coil L1, and the electrode 2 that is provided at a position adjacent to or in the vicinity of a portion of each of the coils L1 and L2 and is grounded. With this configuration, in the coil component 1 according to preferred embodiment 1 of the present invention, since the electrode 2 is provided at a position adjacent to or in the vicinity of a portion of each of the coils L1 and L2, a noise signal in a frequency band that would pass through the coil component 1 via the stray capacitances of the coils L1 and L2 can be made to flow toward the electrode 2 and the frequency band of a noise signal that passes through the coil component 1 can be reduced.

Furthermore, the spacing between the electrode 2 and the coils L1 and L2 may be smaller than the spacing between the wiring lines of each of the coils L1 and L2. With this configuration, a noise signal of a frequency band that would pass through the coil component 1 via the stray capacitances of the coils L1 and L2 can be made to flow toward the electrode 2.

In the case where the width 2W of the electrode 2 is smaller than the width LW of the wiring lines of the coils L1 and L2, the width 2W of the electrode 2 may preferably be, for example, greater than or equal to about ⅛ the length 2D of the electrode 2. With this configuration, a noise signal of a frequency band that would pass through the coil component 1 via the stray capacitances of the coils L1 and L2 can be made to flow toward the electrode 2.

In the case where the width 2W of the electrode 2 is larger than the width LW of the wiring lines of the coils L1 and L2, the width 2W of the electrode 2 may preferably be, for example, less than or equal to about 1.8 times the width LW of the wiring lines of the coils L1 and L2. With this configuration, a noise signal of a frequency band that would pass through the coil component 1 via the stray capacitances of the coils L1 and L2 can be made to flow toward the electrode 2.

The filter circuit 10 according to a preferred embodiment of the present invention includes the coil component 1 and the capacitor C1 that has one end that is connected to the coils L1 and L2. With this configuration, in the filter circuit 10 according to the present preferred embodiment of the present invention, a noise signal of a frequency band that would pass through the coil component 1 via the stray capacitances of the coils can be made to flow toward the electrode 2, and therefore, the frequency band where the attenuation effect of the filter circuit 10 occurs can be widened.

Preferred Embodiment 2

Figure 8A:
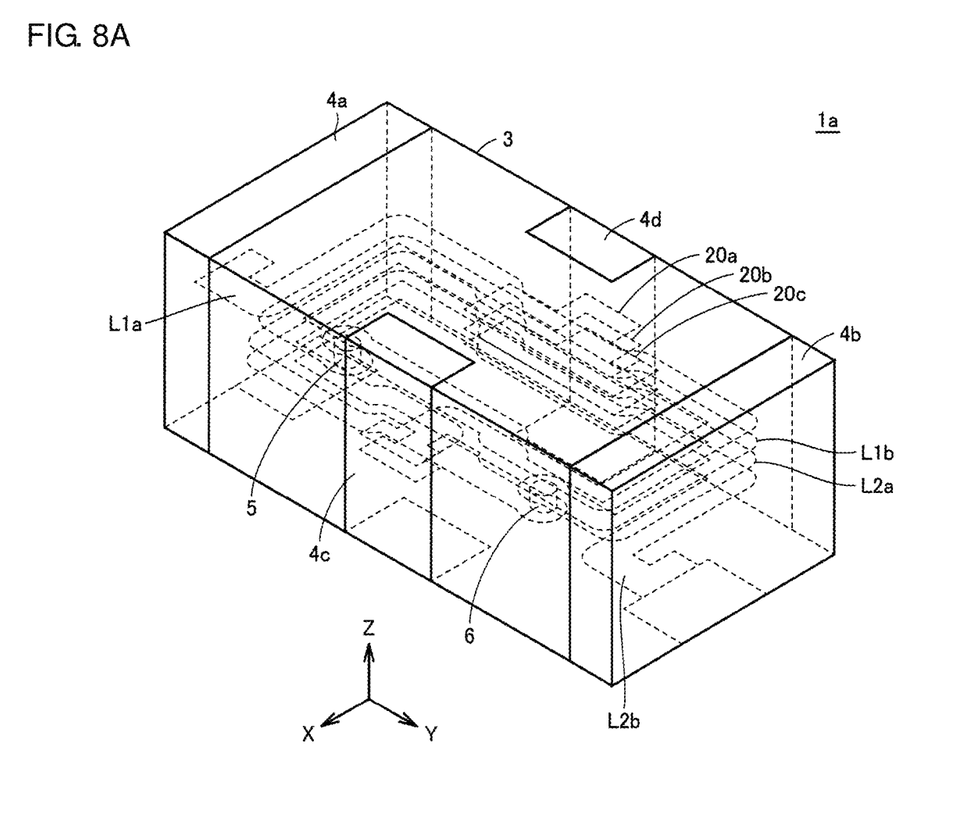
FIGS. 8A and 8B are a perspective view and a side view of a coil component according to a preferred embodiment 2 of the present invention.
Figure 8B:
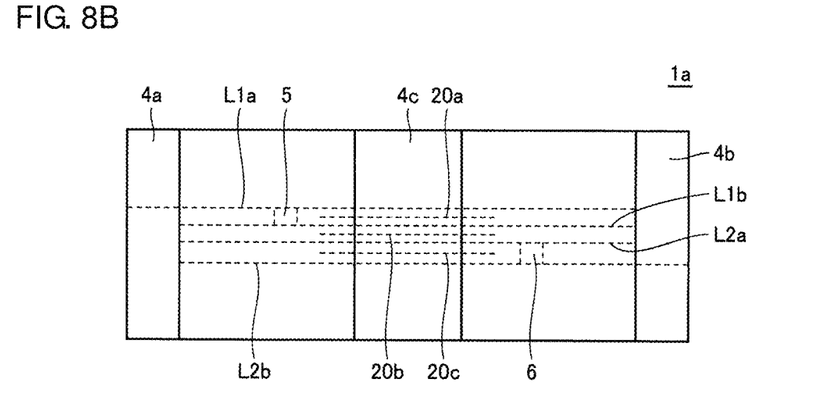

In the coil component 1 according to preferred embodiment 1 of the present invention, one electrode 2 is provided at a position adjacent to or in the vicinity of a portion of each of the coils L1 and L2 as illustrated in FIGS. 1A and 1B, but a plurality of such electrodes may instead be provided. FIGS. 8A and 8B are a perspective view and a side view of a coil component according to a preferred embodiment 2 of the present invention. FIGS. 9A to 9G are exploded plan views illustrating the configuration of the coil component according to preferred embodiment 2 of the present invention. The circuit configuration of a filter circuit including the coil component according to preferred embodiment 2 is the same or substantially the same as the circuit configuration illustrated in FIG. 3, and therefore, detailed description thereof will not be repeated.

As illustrated in FIGS. 8A and 8B, a coil component 1a is provided by stacking a plurality of substrates on which coil wiring lines are provided. One end of a wiring line L1a of a coil L1 stacked as an upper layer is electrically connected to an electrode 4a and the other end of the wiring line L1a is electrically connected to a wiring line L1b of the coil L1 in the layer below the upper layer through a via 5. One end of the wiring line L1b of the coil L1 is electrically connected to an electrode 4c and the other end of the wiring line L1b is electrically connected to the wiring line L1a of the coil L1 in the upper layer through the via 5. The coil L1 is defined by the wiring line L1a and the wiring line L1b. In addition, an electrode 20a is stacked between the wiring line L1a and the wiring line L1b of the coil L1. One end of the electrode 20a is electrically connected to an electrode 4d and the electrode 20a is not electrically connected to the wiring line L1a and the wiring line L1b. Here, in the coil component illustrated in FIG. 1A, the short side direction is an X direction, the long side direction is a Y direction, and the height direction is a Z direction. In addition, the stacking direction of the substrates is a Z direction and the direction of the arrow indicates the direction of an upper layer.

In the coil component 1a, an electrode 20b is stacked between the wiring line L1b of the coil L1 and the wiring line L2a of the coil L2. One end of the electrode 20b is electrically connected to the electrode 4d and the electrode 20b is not electrically connected to the wiring line L1b and the wiring line L2a.

One end of a wiring line L2a of the coil L2 stacked below the coil L1 is electrically connected to the electrode 4c and the other end of the wiring line L2a is electrically connected to a wiring line L2b of the coil L2 in the layer therebelow through a via 6. One end of the wiring line L2b of the coil L2 is electrically connected to the electrode 4b and the other end of the wiring line L2b is electrically connected to a wiring line L2a of the coil L2 in the layer thereabove through the via 6. The coil L2 is defined by the wiring line L2a and the wiring line L2b. In addition, an electrode 20c is stacked between the wiring line L2a and the wiring line L2b of the coil L2. One end of the electrode 20c is electrically connected to the electrode 4d and the electrode 20c is not electrically connected to the wiring line L2a and the wiring line L2b.

The three electrodes 20a to 20c are provided in the coil component 1a, instead of the electrode 2 illustrated in FIGS. 1A and 1B. Since a parasitic capacitance can be increased by providing a plurality of electrodes rather than as a single electrode, the sizes of the electrodes themselves can be decreased provided that the same capacitance is obtained. Specifically, for example, for the case of one electrode 2 having a width 2W of about 160 μm and a length 2D of about 1120 μm, the length 2D of each of the three electrodes 20a to 20c can be decreased to about 500 μm while taking into account the reduction in parasitic inductance.

As illustrated in FIGS. 9A to 9G, wiring line patterns are provided on ceramic green sheets 3a to 3g by performing printing with a conductive paste (for example, Ni paste) using a screen printing method, for example. The wiring line L1a and additionally a wiring line pattern 40 that is connected to the electrode 4a and a wiring line pattern 5a that is connected to the via 5 are provided on the ceramic green sheet 3a illustrated in FIG. 9A.

Figure 9A:
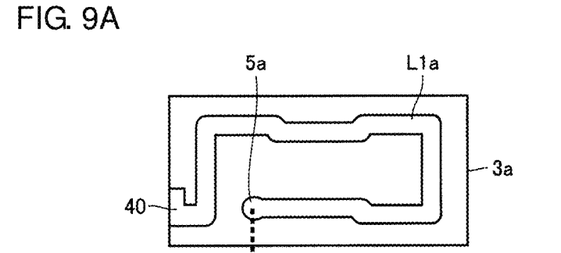
FIGS. 9A to 9G are exploded plan views illustrating the configuration of the coil component according to preferred embodiment 2 of the present invention.
Figure 9B:
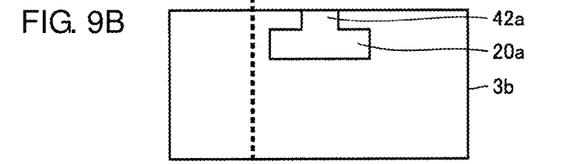

The electrode 20a and additionally a wiring line pattern 42a that is connected to the electrode 4d are provided on the ceramic green sheet 3b illustrated in FIG. 9B.

Figure 9C:
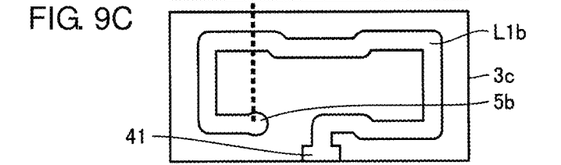

The wiring line L1b and additionally a wiring line pattern 41 that is connected to the electrode 4c and a wiring line pattern 5b that is connected to the via 5 are provided on the ceramic green sheet 3c illustrated in FIG. 9C. The coil L1 is provided on the ceramic green sheets 3a and 3c.

Figure 9D:
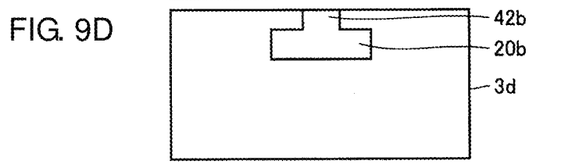

The electrode 20b and additionally a wiring line pattern 42b that is connected to the electrode 4d are provided on the ceramic green sheet 3d illustrated in FIG. 9D.

Figure 9E:
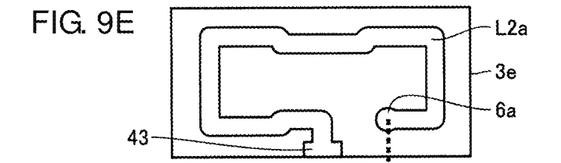

The wiring line L2a and additionally a wiring line pattern 43 that is connected to the electrode 4c and a wiring line pattern 6a that is connected to the via 6 are provided on the ceramic green sheet 3e illustrated in FIG. 9E.

Figure 9F:
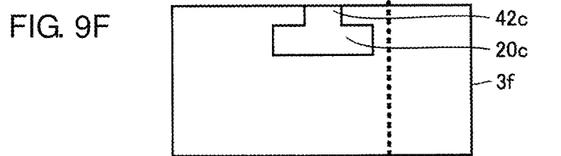

The electrode 20c and additionally a wiring line pattern 42c that is connected to the electrode 4d are provided on the ceramic green sheet 3f illustrated in FIG. 9F.

Figure 9G:
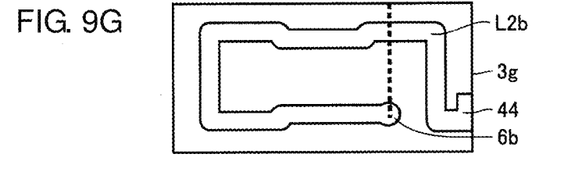

The wiring line L2b and additionally a wiring line pattern 44 that is connected to the electrode 4b and a wiring line pattern 6b that is connected to the via 6 are provided on the ceramic green sheet 3g illustrated in FIG. 9G. The coil L2 is provided on the ceramic green sheets 3e and 3g.

In the coil component 1a, the plurality of ceramic green sheets 3a to 3g illustrated in FIGS. 9A to 9G are stacked on top of one another, and a plurality of ceramic green sheets on which wiring line patterns have not been provided by printing (dummy layers) are stacked above and below these stacked ceramic green sheets (refer to FIG. 8B). The plurality of ceramic green sheets 3 including the dummy layers are subjected to pressure bonding and an unfired multilayer body is formed. The multilayer body is fired and the electrodes 4a to 4d are formed by baking copper electrodes, for example, on the outside of the fired multilayer body so that the electrodes are electrically connected to the wiring line patterns 40 to 44.

As described above, in the coil component 1a according to preferred embodiment 2 of the present invention, electrodes 20a to 20c may be defined by a plurality of electrodes and the electrodes 20a to 20c may be respectively provided at a position between wiring lines of the coil L1, a position between a wiring line of the coil L1 and a wiring line of the coil L2, and a position between the wiring lines of the coil L2. With this configuration, the sizes of the electrodes 20a to 20c can be reduced. Three electrodes 20a to 20c have been exemplified above, but the present invention is not limited to this example and two or a greater number of electrodes may be provided.

Preferred Embodiment 3

Figure 10:
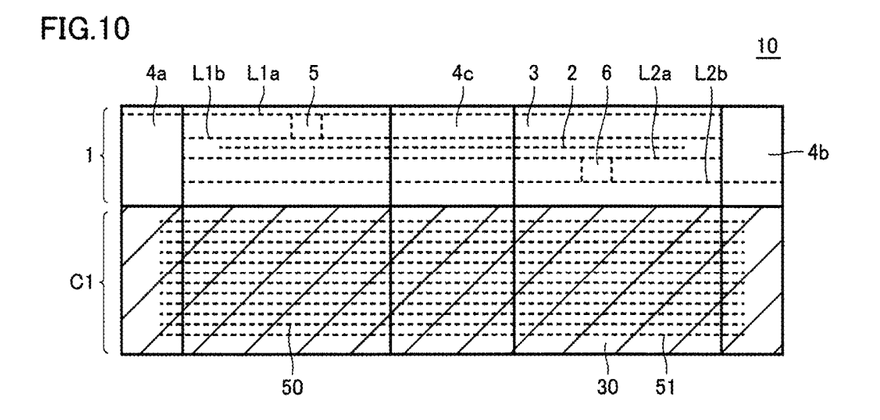
FIG. 10 is a side view of a filter circuit according to preferred embodiment 3 of the present invention.

The configurations of only the coil components 1 and 1a have been described in preferred embodiments 1 and 2 of the present invention. In a preferred embodiment 3 of the present invention, the configuration of a filter circuit in which such a coil component is integrated with a capacitor will be described. FIG. 10 is a side view of a filter circuit according to preferred embodiment 3 of the present invention. The circuit configuration of a filter circuit according to preferred embodiment 3 is the same or substantially the same as the circuit configuration illustrated in FIG. 3, and therefore detailed description thereof will not be repeated. In addition, the coil component used in the filter circuit is the same or substantially the same as the coil component 1 or 1a described in preferred embodiments 1 and 2, and therefore detailed description thereof will not be repeated.

In the filter circuit 10 illustrated in FIG. 10, the coil component 1 is provided in a layer above the capacitor C1, which is a multilayer ceramic capacitor. In the capacitor C1, an inner electrode 50, which is electrically connected to the electrode 4c, and an inner electrode 51 that is electrically connected to the electrode 4d (refer to FIGS. 1A and 1B) is repeated stacked (for example, 200 times) in order to provide the required capacitance. In other words, the capacitor C1 is provided by stacking a plurality of ceramic green sheets 30 (dielectric layers) and a plurality of inner electrodes 50 and 51.

It is preferable for a material having a low relative dielectric constant to be used for the coil component 1 in order to reduce or prevent the stray capacitances C2 and C3, whereas it is preferable that a material having a high relative dielectric constant is used for the capacitor C1 in order to provide the required capacitance. In particular, in order to integrate the coil component 1 and the capacitor C1 and provide a small thin filter circuit 10, ceramic green sheets 3 (for example, titanium oxide-based ceramic green sheets) having a low relative dielectric constant (for example, about 10 or lower) are preferably used for the coil component 1 and ceramic green sheets 30 (for example, barium titanate-based ceramic green sheets) having a high relative dielectric constant (for example, about 100 or lower) are preferably used for the capacitor C1.

As described above, the capacitor C1 according to preferred embodiment 3 of the present invention is provided in a layer below the coil component 1 in which the coils L1 and L2 are stacked and is provided by stacking a plurality of ceramic green sheets 30 and a plurality of inner electrodes 50 and 51. With this configuration, in the filter circuit 10 according to preferred embodiment 3 of the present invention, the coil component 1 and the capacitor C1 can be integrated with each other.

Furthermore, it is preferable that the relative dielectric constant of the ceramic green sheets 30 is higher than the relative dielectric constant of the coil component 1. With this configuration, the filter circuit 10 in which the coil component 1 and the capacitor C1 are integrated with each other can be reduced in size and thickness.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil component comprising:
   a first coil;
   a second coil that magnetically couples with the first coil and causes a negative inductance to be generated; and
   an electrode that is provided at a position adjacent to or in a vicinity of a portion of the first coil and a portion of the second coil and is grounded; wherein
   a spacing between the electrode and an adjacent wiring line of at least one of the first coil and the second coil is smaller than at least one of a spacing between adjacent wiring lines of the first coil and a spacing between adjacent wiring lines of the second coil.

2. The coil component according to claim 1, wherein
   a width of the electrode is smaller than a width of wiring lines of at least one of the first coil and the second coil; and
   the width of the electrode is greater than or equal to about ⅛ a length of the electrode.

3. The coil component according to claim 1, wherein
a width of the electrode is larger than a width of wiring lines of at least one of the first coil and the second coil; and
the width of the electrode is less than or equal to about 1.8 times the width of the wiring lines of the first coil or the wiring lines of the second coil.

4. The coil component according to claim 1, wherein
the electrode includes a plurality of electrodes; and
the plurality of electrodes are each provided at any one of a position between wiring lines of the first coil, a position between a wiring line of the first coil and a wiring line of the second coil, and a position between wiring lines of the second coil.

5. The coil component according to claim 1, wherein the first coil includes two wiring lines connected to one another through a via.

6. The coil component according to claim 1, wherein the second coil includes two wiring lines connected to one another through a via.

7. A filter circuit comprising:
the coil component according to claim 1; and
a capacitor including one end that is connected to the first coil and the second coil.

8. The filter circuit according to claim 7, wherein
the capacitor is provided in a layer below the coil component in which the first coil and the second coil are stacked; and
the capacitor includes a plurality of dielectric layers and a plurality of inner electrodes that are stacked.

9. The filter circuit according to claim 8, wherein a relative dielectric constant of the plurality of dielectric layers is higher than a relative dielectric constant of the coil component.

10. The filter circuit according to claim 7, wherein the spacing between the electrode and the adjacent wiring line of the first coil or the adjacent wiring line of the second coil is smaller than the spacing between the adjacent wiring lines of the first coil and the spacing between the adjacent wiring lines of the second coil.

11. The filter circuit according to claim 8, wherein
a width of the electrode is smaller than a width of wiring lines of the first coil or wiring lines of the second coil; and
the width of the electrode is greater than or equal to about ⅛ a length of the electrode.

12. The filter circuit according to claim 7, wherein
a width of the electrode is larger than a width of wiring lines of the first coil or wiring lines of the second coil; and
the width of the electrode is less than or equal to about 1.8 times the width of the wiring lines of the first coil or the wiring lines of the second coil.

13. The filter circuit according to claim 7, wherein
the electrode includes a plurality of electrodes; and
the plurality of electrodes are each provided at any one of a position between wiring lines of the first coil, a position between a wiring line of the first coil and a wiring line of the second coil, and a position between wiring lines of the second coil.

14. The filter circuit according to claim 8, wherein the plurality of dielectric layers include $BaTiO_3$ as a main component.

15. The filter circuit according to claim 7, wherein the first coil includes two wiring lines connected to one another through a via.

16. The filter circuit according to claim 7, wherein the second coil includes two wiring lines connected to one another through a via.

17. A coil component comprising:
a first coil;
a second coil that magnetically couples with the first coil and causes a negative inductance to be generated;
an electrode that is provided at a position adjacent to or in a vicinity of a portion of the first coil and a portion of the second coil and is grounded through a first path; and
an electrode that is directly connected between the first coil and the second coil and is connected to ground through a second path that is different from the first path.

18. The coil component according to claim 17, wherein the electrode that is provided at the position adjacent to or in the vicinity of the portion of the first coil and the portion of the second coil is not electrically connected to the first coil and the second coil.

* * * * *